United States Patent
Cho et al.

(10) Patent No.: US 9,344,115 B2
(45) Date of Patent: May 17, 2016

(54) METHOD OF COMPRESSING AND RESTORING CONFIGURATION DATA

(71) Applicant: SAMSUNG ELECTRONICS CO., LTD., Suwon-si (KR)

(72) Inventors: Young-chul Cho, Yongin-si (KR); Do-hyung Kim, Hwaseong-si (KR); Suk-jin Kim, Seoul (KR); Si-hwa Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/671,377

(22) Filed: Mar. 27, 2015

(65) Prior Publication Data

US 2015/0280740 A1 Oct. 1, 2015

(30) Foreign Application Priority Data

Mar. 27, 2014 (KR) .................. 10-2014-0036251

(51) Int. Cl.
*H03M 7/00* (2006.01)
*H03M 7/30* (2006.01)

(52) U.S. Cl.
CPC . *H03M 7/60* (2013.01); *H03M 7/30* (2013.01)

(58) Field of Classification Search
CPC .................................. H03M 7/60; H03M 7/30
USPC ............................................... 341/51, 87, 106
See application file for complete search history.

(56) References Cited

U.S. PATENT DOCUMENTS

| 7,124,279 B2 * | 10/2006 | Topham | G06F 9/30178 712/24 |
| 7,290,122 B2 * | 10/2007 | May | G06F 1/3203 712/224 |
| 7,774,581 B2 * | 8/2010 | Baek | G06F 9/30156 712/204 |
| 2013/0067207 A1 | 3/2013 | Jin | |

* cited by examiner

*Primary Examiner* — Khai M Nguyen
(74) *Attorney, Agent, or Firm* — Sughrue Mion, PLLC (57) ABSTRACT

A method of compressing configuration data used in a reconfigurable processor including generating one piece of combined data by combining configuration data used at two or more cycles and generating a bit table indicating valid operations at each of the two or more cycles among operations included in the combined data.

18 Claims, 8 Drawing Sheets

METHOD OF COMPRESSING AND RESTORING CONFIGURATION DATA

RELATED APPLICATION

This application claims the benefit of Korean Patent Application No. 10-2014-0036251, filed on Mar. 27, 2014, in the Korean Intellectual Property Office, the disclosure of which is incorporated herein in its entirety by reference.

BACKGROUND

1. Field

One or more embodiments of the present invention relate to methods of compressing and restoring configuration data.

2. Description of the Related Art

Reconfigurable architecture refers to an architecture in which a hardware configuration of a computing device may be changed to optimally perform a specific task. When a task is processed only in a hardware manner in a computing device, it is difficult to efficiently carry out the task if changes occur during the processing of the task. This difficulty is caused because of fixed functions of the hardware. In contrast, if a task is processed only in a software manner, the task may be processed by reconfiguring the software if changes occur during the process of the task. However, the processing speed when the task is processed in a software manner is slower than when the task is processed in a hardware manner.

The reconfigurable architecture may be implemented to satisfy efficiencies obtainable when a task is processed in both of the software and hardware manners. Particularly, reconfigurable architecture has drawn more attention from the digital signal processing field in which a specific task is repeatedly processed.

Among various types of reconfigurable architecture, a coarse-grained array (CGA) is a representative reconfigurable architecture. Recently, a reconfigurable architecture utilizing a specific processing unit of a CGA as a very long instruction word (VLIW) machine has been introduced.

SUMMARY

One or more embodiments of the present invention include a method of compressing and restoring configuration data.

Additional aspects will be set forth in part in the description which follows and, in part, will be apparent from the description, or may be learned by practice of the presented embodiments.

According to one or more embodiments of the present invention, a method of compressing configuration includes: generating one piece of combined data by combining configuration data used at two or more cycles; and generating a bit table indicating valid operations at each of the two or more cycles among operations included in the combined data.

According to one or more embodiments of the present invention, an apparatus for compressing configuration data includes: a combined data generator generating one piece of combined data by combining configuration data used at two or more cycles; and a bit table generator generating a bit table indicating valid operations at each of the two or more cycles among operations included in the combined data.

According to one or more embodiments of the present invention, a method of restoring configuration data includes: receiving combined data generated by combining configuration data used at two or more cycles; and receiving a bit table indicating valid operations in each cycle, and restoring configuration data including only valid operations in each cycle among operations included in the combined data based on the bit table.

According to one or more embodiments of the present invention, an apparatus for restoring configuration data includes: a receiving unit receiving combined data generated by combining configuration data used at two or more cycles; and a restoring unit receiving a bit table indicating valid operations in each cycle, and restoring configuration data including only valid operations in each cycle among operations included in the combined data based on the bit table.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Figure 1:
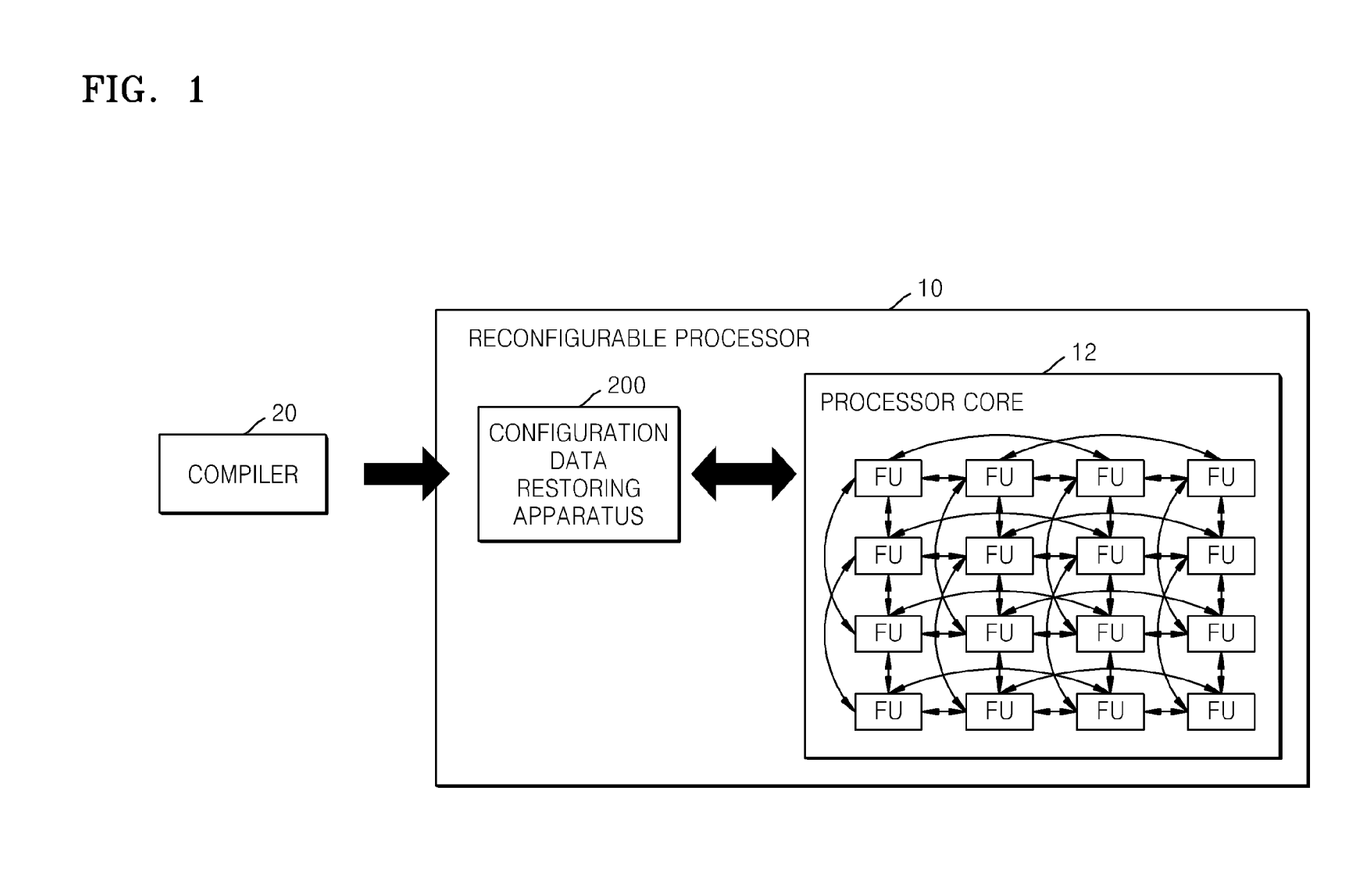
FIG. 1 is a block diagram of a compiler and a reconfigurable processor according to an embodiment of the present invention.

FIG. 1 is a block diagram of a compiler 20 and a reconfigurable processor 10 according to an embodiment of the present invention. Referring to FIG. 1, the reconfigurable processor 10 includes a configuration data restoring apparatus 200 and a processor core 12 including a plurality of function units (FUs) and register files.

The compiler 20 compresses configuration data and transmit the compressed configuration data to the reconfigurable processor 10. The compiler 20 compresses a plurality of pieces of configuration data into one piece of combined data in order to reduce a volume of the configuration data. A method of compressing the configuration data by the compiler 20 will be described in more detail with reference to the following drawings.

The configuration data restoring apparatus 200 decompresses the compressed configuration data and outputs the restored configuration data to the processor core 12. The processor core 12 allocates operations to the function units FUs based on information included in the configuration data, and the function units FUs perform the allocated operations in each cycle.

FIG. 1 only illustrates constituent elements of the reconfigurable processor 10 related to the current embodiment so as not to obscure the essence of the invention. Thus, it will be understood by those of ordinary skill in the art that general-use elements in addition to the constituent elements illustrated in FIG. 1 may also be included.

Figure 2:
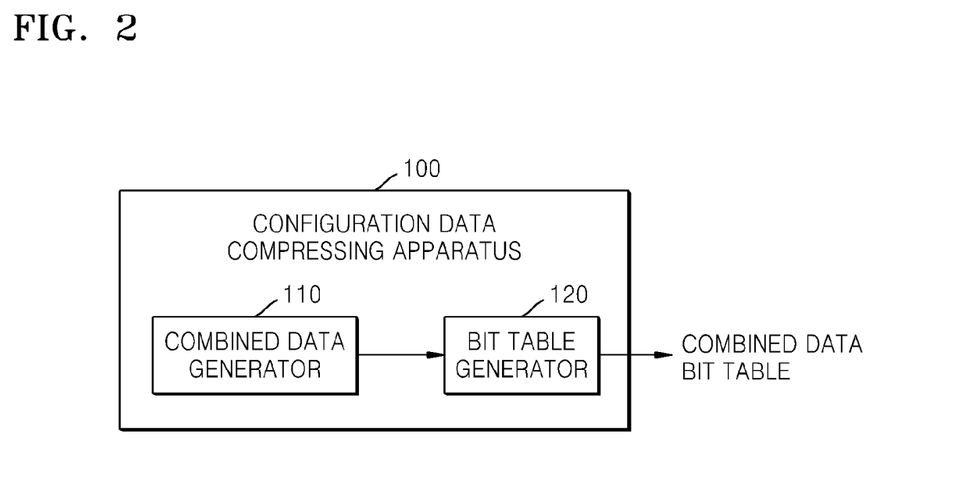
FIG. 2 is a block diagram for describing a configuration data compressing apparatus according to an embodiment of the present invention.

FIG. 2 is a block diagram for describing a configuration data compressing apparatus 100 according to an embodiment of the present invention. Referring to FIG. 2, the configuration data compressing apparatus 100 compresses a plurality of pieces of configuration data to generate combined data and generates a bit table used to restore the configuration data.

The configuration data, which is data including operation code (OP code) of function units scheduled to be performed or compiled by the compiler 20 or connection information between the function units, includes information related to a processing schedule for operations performed by the reconfigurable processor 10.

The configuration data compressing apparatus 100 includes a combined data generator 110 and a bit table generator 120.

The combined data generator 110 receives a plurality of pieces of configuration data and combines the plurality of pieces of configuration data to generate combined data. The configuration data may include a No Operation (NOP) indicator with respect to a predetermined function unit. A NOP indicator indicates that the function unit performs no operation.

The combined data generator 110 combines a plurality of pieces of configuration data scheduled to be performed in two or more cycles to generate one piece of combined data. Each of the cycles refers to a processing order or processing time of configuration data.

The combined data generator 110 combines a plurality of pieces of configuration data in accordance with a predetermined rule. For example, the combined data generator 110 combines two or more pieces of configuration data having valid operations not assigned to the same function unit, thereby generating combined data.

The bit table generator 120 generates a bit table that indicates valid operations in each cycle among operations included in the combined data. Since one piece of combined data is generated by combining two or more pieces of configuration data, some of the operations included in the combined data are valid in a predetermined cycle, while other operations included in the combined data are valid in another predetermined cycle. Thus, the bit table generator 120 generates the bit table and indicates valid operations in each cycle. Examples of the bit table will be described in more detail with reference to FIGS. 5 and 6.

The configuration data compressing apparatus 100 outputs the combined data and the bit table to the reconfigurable processor 10.

Figure 3:
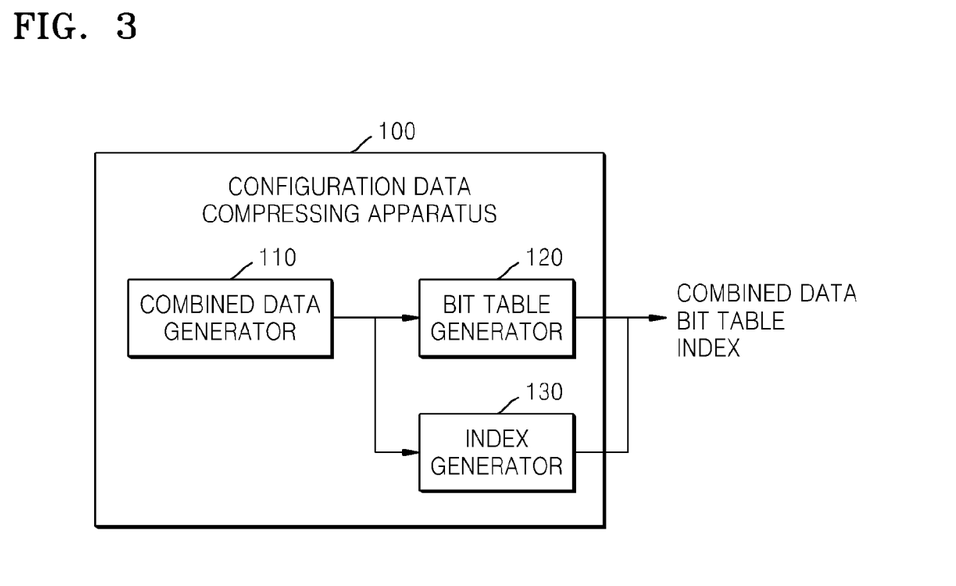
FIG. 3 is a block diagram for describing a configuration data compressing apparatus according to another embodiment of the present invention.

FIG. 3 is a block diagram for describing a configuration data compressing apparatus 100 according to another embodiment of the present invention. Referring to FIG. 3, the configuration data compressing apparatus 100 further includes an index generator 130.

When two or more pieces of combined data are generated by the combined data generator 110, the index generator 130 generates an index to identify pieces of combined data used in each cycle from among the two or more pieces of combined data.

Figure 5:
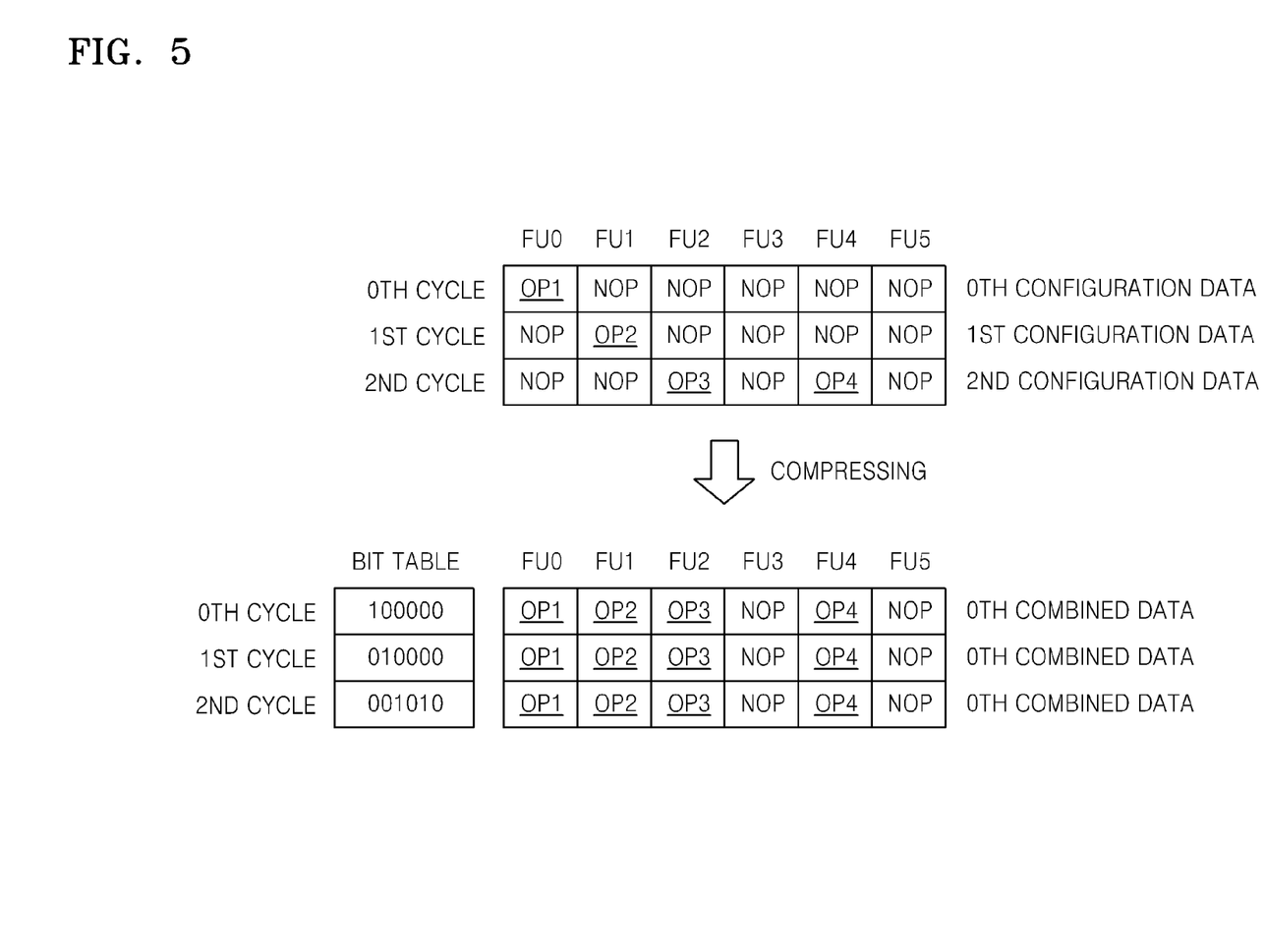
FIG. 5 is a diagram for describing a method of generating combined data and a bit table and restoring configuration data.
Figure 6:
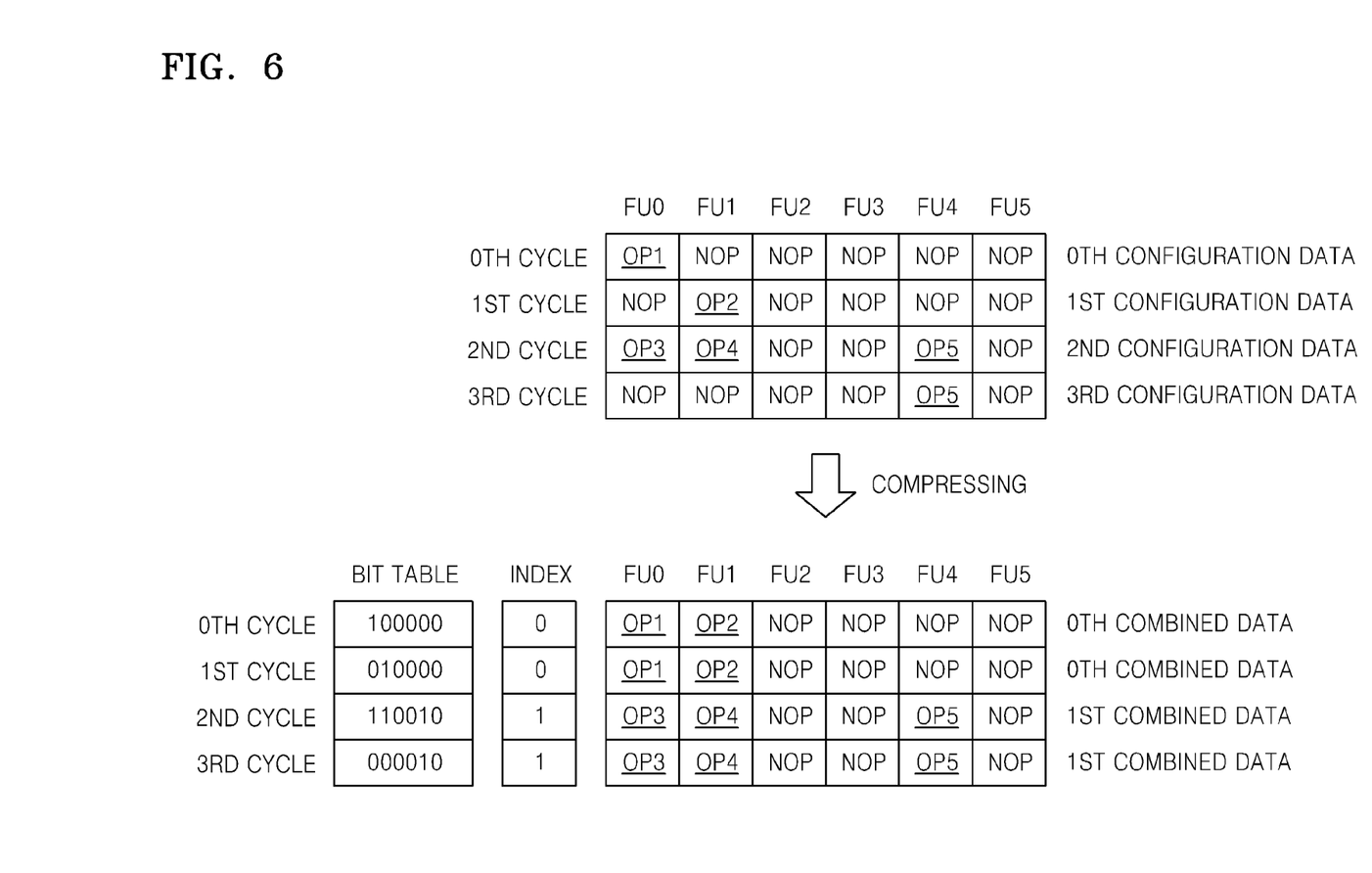
FIG. 6 is a diagram for describing a method of generating combined data, a bit table, and an index and restoring configuration data.

The configuration data compressing apparatus 100 outputs the combined data, the bit table, and the index to the reconfigurable processor 10. The index will be described in more detail with reference to FIS. 5 and 6.

Figure 4:
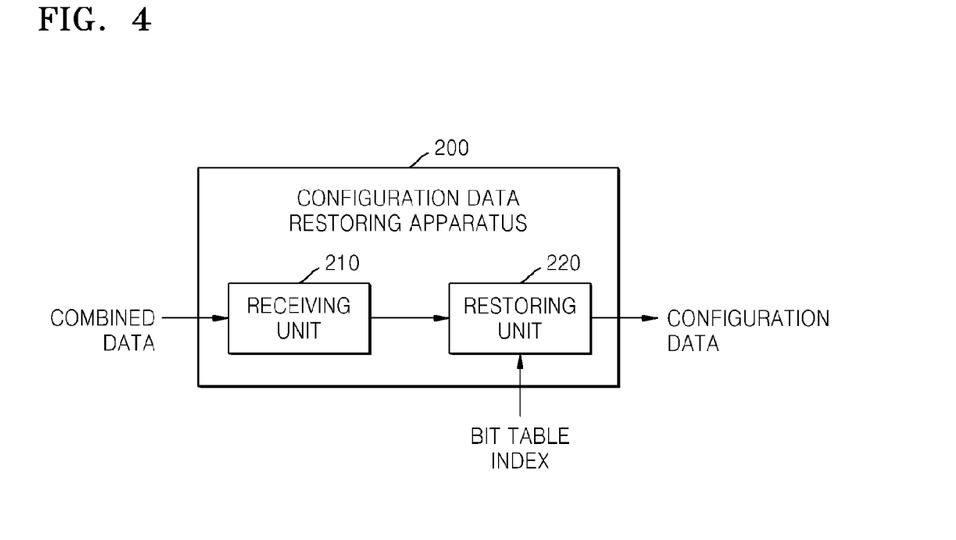
FIG. 4 is a block diagram for describing a configuration data restoring apparatus.

FIG. 4 is a block diagram for describing a configuration data restoring apparatus 200. Referring to FIG. 4, the configuration data restoring apparatus 200 includes a receiving unit 210 and a restoring unit 220.

The receiving unit 210 receives combined data generated by combining configuration data used in two or more cycles from the compiler 20. The receiving unit 210 outputs the combined data to the restoring unit 220. If there are a plurality of pieces of combined data, the receiving unit 210 may output, from among a plurality of pieces of combined data, combined data requested by the restoring unit 220.

The restoring unit 220 receives a bit table indicating valid operations in each cycle from the compiler 20 and restores configuration data including only valid operations in each cycle from among the operations included in the combined data, based on the bit table. The restoring unit 220 determines a function unit to which a valid operation is assigned from among the operations included in the combined data, based on information included in the bit table. Based on the determination, the restoring unit 220 generates configuration data including only valid operations.

The restoring unit 220 determines combined data based on the index and restores configuration data by using the determined combined data. When there are two or more pieces of combined data received from the receiving unit 210, the restoring unit 220 receives an index from the compiler 20. The index identifies combined data used in each cycle from among the two or more pieces of combined data. The restoring unit 220 determines combined data to be applied to in each cycle from among the two or more pieces of combined data in accordance with an index number indicated by the index. The restoring unit 220 restores configuration data including only valid operations from among the operations included in the determined combined data in each cycle.

The restoring unit 220 outputs the restored configuration data to the processor core 12 in each cycle.

FIG. 5 is a diagram for describing a method of generating combined data and a bit table and restoring configuration data. Referring to FIG. 5, the configuration data compressing apparatus 100 compresses three pieces of configuration data ($0^{th}$ to $2^{nd}$ pieces of configuration data) into one piece of $0^{th}$ combined data. The configuration data restoring apparatus 200 restores the three pieces of the configuration data ($0^{th}$ to $2^{nd}$ pieces of configuration data) by using the one piece of $0^{th}$ combined data and the bit table.

The compiler 20 respectively schedules the $0^{th}$ to $2^{nd}$ pieces of configuration data to be performed during the $0^{th}$ to $2^{nd}$ cycles. As a result of the scheduling, the $0^{th}$ configuration data includes an operation OP1 which is valid in FU0. The $1^{st}$ configuration data includes an operation OP2 which is valid in FU1. The $2^{nd}$ configuration data includes an operation OP3 which is valid in FU2.

The $0^{th}$ configuration data is scheduled to be performed by the processor core 12 during the $0^{th}$ cycle, the $1^{st}$ configuration data is scheduled to be performed the processor core 12 during the $1^{st}$ cycle, and the $2^{nd}$ configuration data is scheduled to be performed the processor core 12 during the $2^{nd}$ cycle.

The configuration data compressing apparatus 100 generates the $0^{th}$ combined data and the bit table. The $0^{th}$ combined data is data obtained by combining the $0^{th}$ to $2^{nd}$ pieces of configuration data. The $0^{th}$ combined data includes OP1 for FU0, OP2 for FU1, OP3 for FU2, and OP4 for FU4. Since the $0^{th}$ to $2^{nd}$ pieces of configuration data do not include an operation assigned to the same function unit, they may be combined into one piece of combined data.

The configuration data compressing apparatus 100 generates a bit table indicating valid operations in each cycle among the operations included in the combined data.

In the $0^{th}$ cycle, since data stored in the bit table is '100000', only the operation for FU0 in the $0^{th}$ combined data is valid. In the $1^{st}$ cycle, since data stored in the bit table is '010000', only the operation for FU1 in the $0^{th}$ combined data is valid. In the $2^{nd}$ cycle, since data stored in the bit table is '001010', only the operations for FU2 and FU4 in the $0^{th}$ combined data are valid.

The configuration data compressing apparatus 100 outputs the $0^{th}$ combined data and the bit table to the configuration data restoring apparatus 200. Thus, the configuration data compressing apparatus 100 may not output all of the $0^{th}$ to $2^{nd}$ pieces of configuration data to the configuration data restoring apparatus 200, but output only the $0^{th}$ combined data and the bit table to the configuration data restoring apparatus 200.

The configuration data restoring apparatus 200 restores the configuration data for the $0^{th}$ to $2^{nd}$ cycles by using the $0^{th}$ combined data and the bit table. The configuration data restoring apparatus 200 determines a valid operation among the operations included in the $0^{th}$ combined data by referring to data included in the bit table.

For example, for the $2^{nd}$ cycle, since data stored in the bit table is '001010', the configuration data restoring apparatus 200 determines that only the operations for FU2 and FU4 are valid operations and allocates NOPs to the other FUs. Thus, the configuration data restoring apparatus 200 may restore configuration data in which OP3 is allocated to FU2, OP4 is allocated to FU4, and NOPs are allocated to the other FUs in the $2^{nd}$ cycle.

FIG. 6 is a diagram for describing a method of generating combined data, a bit table, and an index and restoring configuration data. Referring to FIG. 6, the configuration data compressing apparatus 100 compresses four pieces of configuration data ($0^{th}$ to $3^{rd}$ pieces of configuration data) into two pieces of combined data ($0^{th}$ to $1^{st}$ pieces of combined data). The configuration data restoring apparatus 200 restores the four pieces of configuration data ($0^{th}$ to $3^{rd}$ pieces of configuration data) by using the two pieces of $0^{th}$ combined data, a bit table, and an index.

The compiler 20 respectively schedules the $0^{th}$ to $3^{rd}$ pieces of configuration data to be performed during the $0^{th}$ to $3^{rd}$ cycles. As a result of the scheduling, the $0^{th}$ configuration data includes an operation OP1 valid in FU0. The $1^{st}$ configuration data includes an operation OP2 valid in FU1. The $2^{nd}$ configuration data includes an operation OP3 which is valid in FU0, an operation OP4 which is valid in FU2, and an operation OP5 which is valid in FU4. The $3^{rd}$ configuration data includes an operation OP5 which is valid in FU4.

The configuration data compressing apparatus 100 generates $0^{th}$ to $1^{st}$ combined data, a bit table, and an index. The $0^{th}$ combined data is data obtained by combining the $0^{th}$ to $1^{st}$ configuration data. The $0^{th}$ combined data includes OP1 for FU0 and OP2 for FU1.

The $1^{st}$ combined data is data obtained by combining the $2^{nd}$ to $3^{rd}$ pieces of configuration data. The $1^{st}$ combined data includes OP3 for FU0, OP4 for FU1, and OP5 for FU4. Since the $2^{nd}$ configuration data and the $0^{th}$ configuration data have different operations for FU0, they cannot be combined. In addition, since the $2^{nd}$ configuration data and the $1^{st}$ configuration data have different operations for FU1, they cannot be combined. Thus, the configuration data compressing apparatus 100 combines the $0^{th}$ configuration data with the $1^{st}$ configuration data and combines the $2^{nd}$ configuration data with the $3^{rd}$ configuration data.

The configuration data compressing apparatus 100 generates an index indicating combined data applied to each cycle and a bit table indicating valid operations in each cycle among the operations included in the combined data.

In the $0^{th}$ cycle, since only the operation for FU0 is valid in the $0^{th}$ combined data, the configuration data compressing apparatus 100 sets the index for the FU0 as 1 and sets the bit table for the $0^{th}$ cycle as '100000'.

In the $1^{st}$ cycle, since only the operation for FU1 is valid in the $0^{th}$ combined data, the configuration data compressing apparatus 100 sets the index for the FU1 as 1 and sets the bit table for the 1st cycle as '010000'.

In the $2^{nd}$ cycle, since only the operations for FU0, FU1, and FU4 are valid in the $1^{st}$ combined data, the configuration data compressing apparatus 100 sets the index for the FU0, FU1, and FU4 as 1 and sets the bit table for the $2^{nd}$ cycle as '110010'.

In the $3^{rd}$ cycle, since only the operation for FU4 is valid in the $1^{st}$ combined data, the configuration data compressing apparatus 100 sets the index for the FU4 as 1 and sets the bit table for the $3^{rd}$ cycle as '000010'.

Thus, the configuration data compressing apparatus 100 may not output all of the $0^{th}$ to 3rd pieces of configuration data to the configuration data restoring apparatus 200, but may output only the $0^{th}$ to $1^{st}$ combined data, the bit table, and the index to the configuration data restoring apparatus 200.

The configuration data restoring apparatus 200 restores the configuration data for the $0^{th}$ to $3^{rd}$ cycles by using the $0^{th}$ to $1^{st}$ combined data, the bit table, and the index. The configuration data restoring apparatus 200 determines combined data applied to each cycle in accordance with the index. The configuration data restoring apparatus 200 restores configuration data by determining valid operations among the operations included in the determined combined data by referring to data included in the bit table.

For example, in the $3^{rd}$ cycle, since the index is 1 and data stored in the bit table is '000010', the configuration data restoring apparatus 200 selects the $1^{st}$ combined data and determines that only OP5 for FU4 is a valid operation in the $1^{st}$ combined data. The configuration data restoring apparatus 200 allocates NOPs to the other FUs except for FU4. Thus, the configuration data restoring apparatus 200 may restore the configuration data in which OP5 is allocated to FU4, and NOPs are allocated to the other FUs in the $3^{rd}$ cycle.

Figure 7:
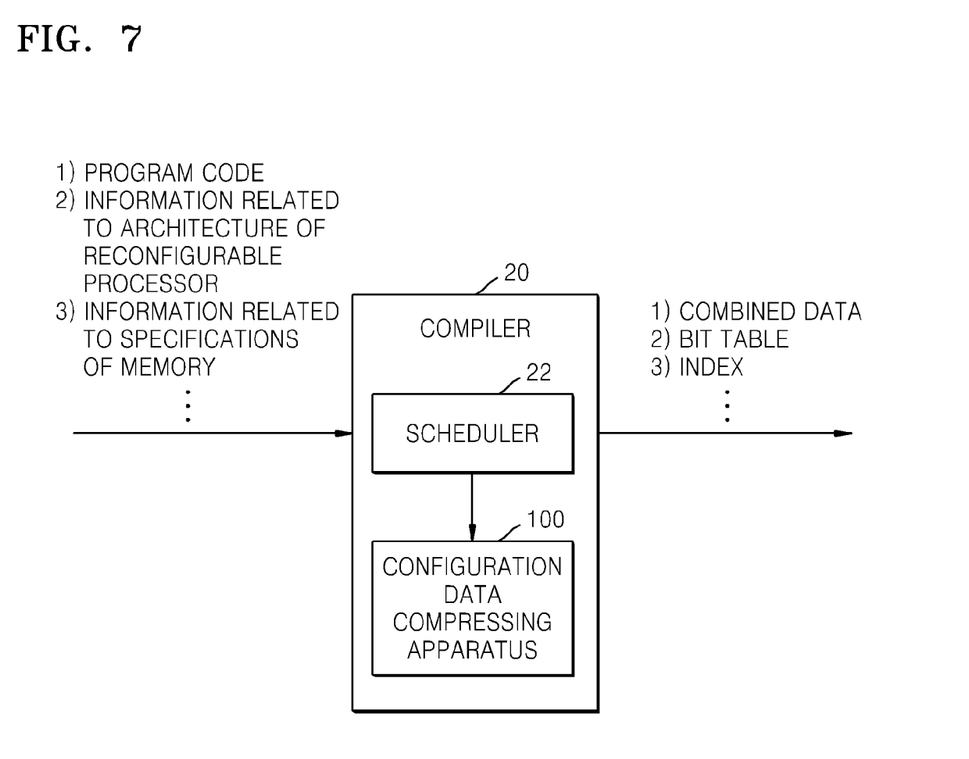
FIG. 7 is a block diagram of a compiler according to an embodiment of the present invention.

FIG. 7 is a block diagram of a compiler 20 according to an embodiment of the present invention. Referring to FIG. 7, the compiler 20 includes a scheduler 22 and a configuration data compressing apparatus 100. FIG. 7 only illustrates constituent elements of the compiler 20 related to the current embodiment so as not to obscure the essence of the invention. Thus, it will be understood by those of ordinary skill in the art that general-use elements in addition to the constituent elements illustrated in FIG. 7 may also be included.

The compiler 20 converts a given program code into a low-level language. For example, the compiler 20 converts a program code of a high-level language into an assembly language or machine language. The compiler 20 schedules operations of function units by using commands of the converted assembly language or machine language. The compiler 20 may use information stored in a memory (not shown) in order to compile the written program code.

The compiler 20 receives a program code, information related to an architecture of a reconfigurable processor, information related to specifications of a memory, and the like. The compiler 20 generates configuration data based on the received information, compresses the generated configuration data, and outputs combined data, a bit table, and an index to the reconfigurable processor 10 or the configuration data restoring apparatus 200.

The scheduler 22 determines a schedule of the function units. Particularly, the scheduler 22 determines operations respectively allocated to the function units in each cycle. The scheduler 22 generates configuration data in each cycle based on the determined schedule.

The configuration data compressing apparatus 100 compresses a plurality of pieces of configuration data into one piece of combined data. In other words, the configuration data compressing apparatus 100 generates a smaller amount of combined data than that of the generated configuration data.

The configuration data compressing apparatus 100 further generates an index and a bit table indicating information related to the combined data.

Figure 8:
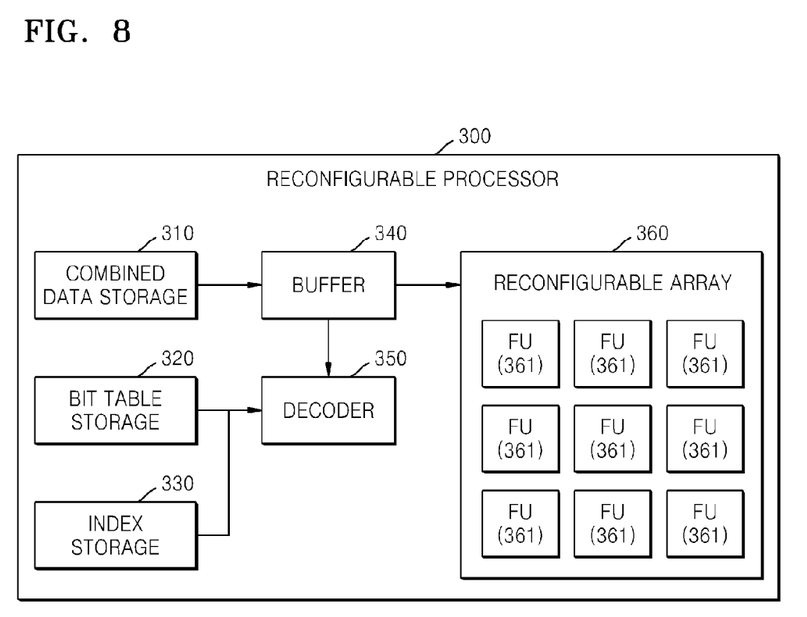
FIG. 8 is a block diagram of a reconfigurable processor according to an embodiment of the present invention.

FIG. 8 is a block diagram of a reconfigurable processor 300 according to an embodiment of the present invention. Referring to FIG. 8, the reconfigurable processor 300 includes a combined data storage 310, a bit table storage 320, an index storage 330, a buffer 340, a decoder 350, and a reconfigurable array 360.

The reconfigurable processor 300 refers to hardware capable of reconfiguring function units 361 of the reconfigurable array 360 to perform predetermined tasks, instructions, or operations. In this regard, the configuration of the function units 361 that perform processing in the reconfigurable processor 300 may be determined by compilation of the compiler 20.

The reconfigurable array 360 includes an array of a plurality of function units 361. The function units 361 of the reconfigurable array 360 may include arithmetic logic units (ALUs), multipliers, load/store units, or the like, and a plurality of input/output paths may be provided between the function units 361. In addition, the reconfigurable array 360 may include various types of register files such as local register files.

The reconfigurable processor 300 may be a coarse grained array (CGA)-based processor. Particularly, the reconfigurable array 360 may support a coarse grained reconfigurable array (CGRA) mode. The reconfigurable array 360 may process loop operations in parallel by using various function units 361 included in the reconfigurable array 360 in accordance with the CGRA mode.

The storages 310 to 330 are memories configured to store configuration data, a bit table, an index, and other data transmitted from the compiler 20. The combined data storage 310 stores combined data generated by the compiler 20 or the configuration data compressing apparatus 100. The bit table storage 320 stores the bit table generated by the compiler 20 or the configuration data compressing apparatus 100. The index storage 330 stores the index generated by the compiler 20 or the configuration data compressing apparatus 100.

The buffer 340 may temporarily store a part of or the entire combined data stored in the combined data storage 310. In addition, the buffer 340 may output configuration data including only some of the operations included in the combined data to the reconfigurable array 360 in accordance with an instruction by the decoder 350.

The decoder 350 restores the configuration data by using information received from the bit table storage 320 and the index storage 330. The decoder 350 receives the index from the index storage 330 and determines combined data corresponding to the received index. The decoder 350 determines valid operations from among the operations included in the determined combined data based on the bit table received from the bit table storage 320. The decoder 350 may control the buffer 340 such that the determined combined data and the determined valid operations are output to the reconfigurable array 360.

Thus, the reconfigurable processor 300 may restore the configuration data corresponding to a number of cycles by using a smaller amount of combined data than that of the cycles.

Figure 9:
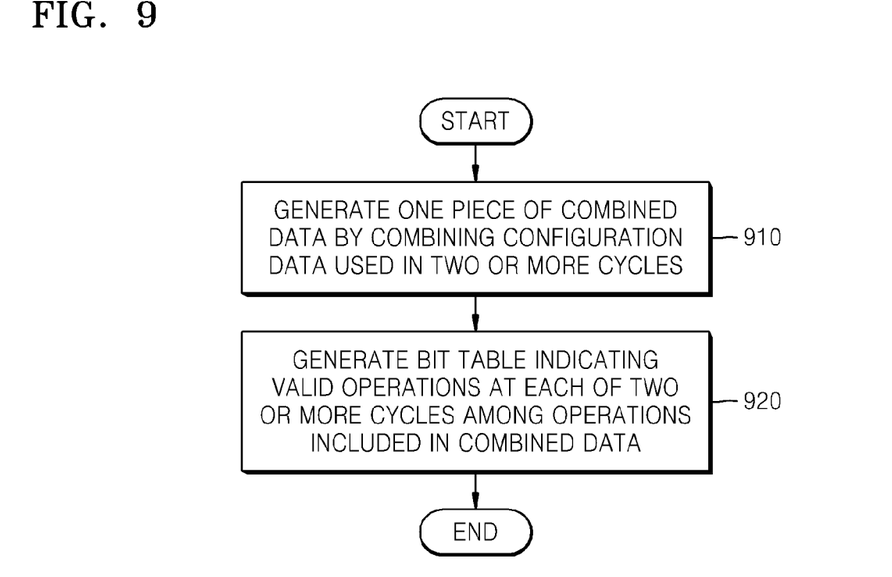
FIG. 9 is a flowchart illustrating a method of compressing configuration data according to an embodiment of the present invention.

FIG. 9 is a flowchart illustrating a method of compressing configuration data according to an embodiment of the present invention. Referring to FIG. 9, configuration data used in two or more cycles are combined to generate one piece of combined data in operation 910.

In operation 920, a bit table, which indicates valid operation at each of the two or more cycles among the operations included in the combined data, is generated.

Figure 10:
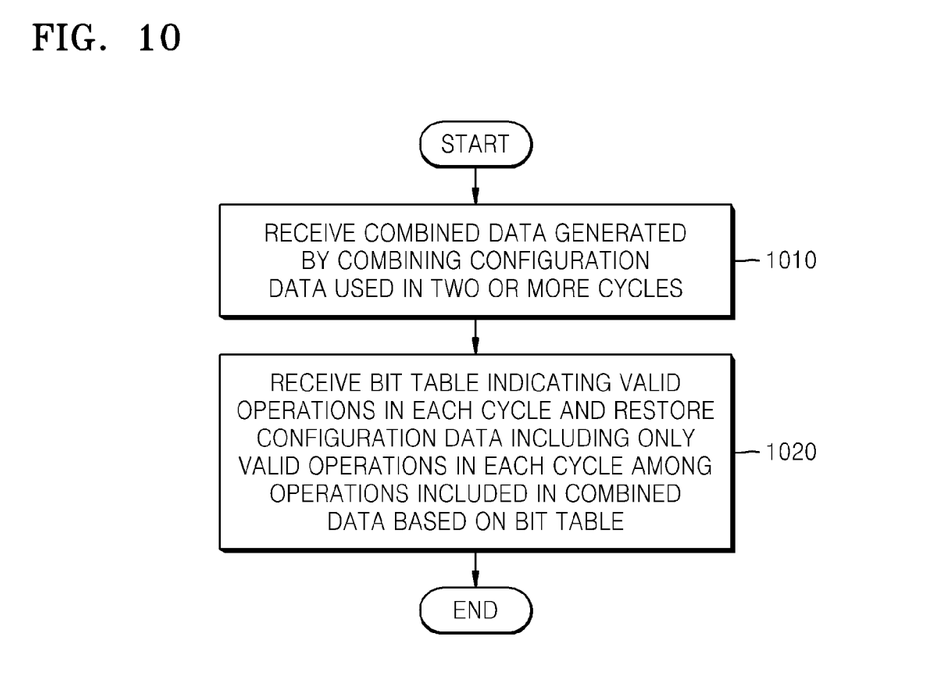
FIG. 10 is a flowchart illustrating a method of restoring configuration data according to an embodiment of the present invention.

FIG. 10 is a flowchart illustrating a method of restoring configuration data according to an embodiment of the present invention. Referring to FIG. 10, combined data generated by combining configuration data used in two or more cycles is received in operation 1010.

In operation 1020, the restoring unit 220 receives a bit table indicating valid operations in each cycle and restores configuration data including only valid operations in each cycle from among the operations included in the combined data based on the bit table.

As described above, according to the method of compressing configuration data according to the one or more of the above embodiments of the present invention, configuration data for different cycles may be compressed into one piece of combined data.

According to the method of compressing configuration data, a bit table including valid operations among the operations included in combined data may be generated.

According to the method of compressing configuration data, an index indicating combined data applied to each cycle from among a plurality of pieces of combined data may be generated.

According to the method of restoring configuration data, configuration data including only valid operations in each cycle may be restored from the combined data by using the bit table.

According to the method of restoring configuration data, combined data applicable to each cycle from among a plurality of pieces of combined data may be determined using the index.

An apparatus according to an embodiment of the present invention may include a processor, a memory for storing program data to be executed by the processor, a permanent storage such as a disk drive, a communications port for handling communications with external devices, and user interface devices, such as a touch panel, key, button, etc. When software modules or algorithms are involved, these software modules or algorithms may be stored as program instructions or computer readable code executable by the processor on a non-transitory computer readable recording media. Examples of the computer readable recording medium include a magnetic storage medium such as read-only memory (ROM), random-access memory (RAM), floppy disks, and hard disks, and an optical data storage device such as CD-ROM and digital versatile disc (DVD). The computer readable recording media may also be a distributed network, so that the computer readable code is stored/transferred and executed in a distributed fashion. The computer readable recording media may be read by a computer, stored in a memory, and executed by a processor.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more central processing unit (CPU) or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the present invention could employ any number of conventional techniques for electronics configuration, signal processing and/or control, data processing and the like. The words "mechanism" and "element" are used broadly and are not limited to mechanical or physical embodiments, but can include software routines in conjunction with processors, etc.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method of compressing configuration data used in a reconfigurable processor, the method comprising:
   generating one piece of combined data by combining configuration data used during two or more cycles; and
   generating a bit table indicating valid operations in each of the two or more cycles from among operations comprised in the combined data.

2. The method of claim 1, further comprising, when two or more pieces of combined data are generated, generating an index configured to identify pieces of combined data used in each cycle from among the two or more pieces of combined data.

3. The method of claim 1, wherein the generating of the one piece of combined data is performed by combining two or more pieces of configuration data having valid operations not assigned to the same function unit.

4. The method of claim 1, wherein the reconfigurable processor is a coarse grained array (CGA)-based processor.

5. The method of claim 1, wherein the reconfigurable processor comprises a plurality of function units, and
   the configuration data used during each of the two or more cycles comprises operations performed by the function units during each of the two or more cycles.

6. An apparatus for compressing configuration data used in a reconfigurable processor comprising:
   a combined data generator generating one piece of combined data by combining configuration data used in two or more cycles; and
   a bit table generator generating a bit table indicating valid operations in each of the two or more cycles from among operations comprised in the combined data.

7. The apparatus of claim 6, further comprising an index generator generating an index configured to identify combined data used in each cycle when there are two or more pieces of combined data.

8. The apparatus of claim 6, wherein the combined data generator generates the one piece of combined data by combining two or more pieces of configuration data having valid operations not assigned to the same function unit.

9. The apparatus of claim 6, wherein the reconfigurable processor is a coarse grained array (CGA)-based processor.

10. The apparatus of claim 6, wherein the reconfigurable processor comprises a plurality of function units, and
    the configuration data used during each of the two more cycles comprises operations performed by the function units during each of the two or more cycles.

11. A method of restoring configuration data used in a reconfigurable processor, the method comprising:
    receiving combined data generated by combining configuration data used in two or more cycles; and
    receiving a bit table indicating valid operations in each cycle, and restoring configuration data comprising only valid operations in each cycle from among operations comprised in the combined data based on the bit table.

12. The method of claim 11, further comprising receiving an index configured to distinguish combined data used in each cycle among two or more combined data if there are two or more pieces of combined data.

13. The method of claim 12, wherein the restoring of the configuration data is performed by:
    determining combined data corresponding to the index in each cycle from among the two or more pieces of combined data, and restoring configuration data comprising only valid operations in each cycle from among operations comprised in the determined combined data.

14. The method of claim 11, wherein the reconfigurable processor is a coarse grained array (CGA)-based processor.

15. An apparatus for restoring configuration data used in a reconfigurable processor comprising:
- a receiving unit receiving combined data generated by combining configuration data used in two or more cycles; and
- a restoring unit receiving a bit table indicating valid operations in each cycle, and restoring configuration data comprising only valid operations in each cycle from among operations comprised in the combined data based on the bit table.

16. The apparatus of claim 15, wherein the restoring unit receives an index configured to distinguish combined data used in each cycle among two or more combined data when there are two or more pieces of combined data.

17. The apparatus of claim 16, wherein the restoring unit determines combined data corresponding to the index in each cycle from among the two or more pieces of combined data, and
- restores configuration data comprising only valid operations in each cycle from among operations comprised in the determined combined data.

18. The apparatus of claim 15, wherein the reconfigurable processor is a coarse grained array (CGA)-based processor.

* * * * *